US009374876B2

(12) United States Patent
Alpert et al.

(10) Patent No.: US 9,374,876 B2
(45) Date of Patent: Jun. 21, 2016

(54) MULTI-CHIP LIGHT EMITTING DIODE LIGHT DEVICE

(76) Inventors: Martin A. Alpert, Beachwood, OH (US); Edward F. Carome, Beachwood, OH (US); Richard L. Hansler, Pepper Pike, OH (US); Vilnis E. Kubulins, Walton Hills, OH (US)

(*) Notice: Subject to any disclaimer, the term of this patent is extended or adjusted under 35 U.S.C. 154(b) by 967 days.

(21) Appl. No.: 12/796,242

(22) Filed: Jun. 8, 2010

(65) Prior Publication Data
US 2010/0244740 A1    Sep. 30, 2010

Related U.S. Application Data

(63) Continuation-in-part of application No. 12/675,077, filed as application No. PCT/US2008/074208 on Aug. 25, 2008, now abandoned.

(60) Provisional application No. 61/217,938, filed on Jun. 5, 2009, provisional application No. 60/965,950, filed on Aug. 24, 2007, provisional application No. 60/995,996, filed on Oct. 1, 2007.

(51) Int. Cl.
*H05B 37/02* (2006.01)
*H01L 33/50* (2010.01)
*H01L 25/075* (2006.01)

(52) U.S. Cl.
CPC ........ *H05B 37/0281* (2013.01); *H01L 25/0753* (2013.01); *H01L 33/50* (2013.01); *H01L 33/504* (2013.01); *Y02B 20/42* (2013.01)

(58) Field of Classification Search
USPC ........... 315/312–326, 185 S, 291, 224; 362/2, 362/11, 13, 600, 601, 612, 227, 230, 231
See application file for complete search history.

(56) References Cited

U.S. PATENT DOCUMENTS

| | | | |
|---|---|---|---|
| 8,081,289 B2* | 12/2011 | Lin et al. | 349/176 |
| 8,282,238 B2* | 10/2012 | Kim | 362/230 |
| 8,567,973 B2* | 10/2013 | Li | C09K 11/0883 362/231 |
| 2007/0159064 A1* | 7/2007 | Choi et al. | 313/502 |
| 2008/0123022 A1* | 5/2008 | Aoki et al. | 349/68 |
| 2009/0281604 A1* | 11/2009 | De Boer et al. | 607/88 |
| 2012/0086338 A1* | 4/2012 | Kim | 315/86 |
| 2012/0176788 A1* | 7/2012 | Van De Ven et al. | 362/231 |
| 2012/0200687 A1* | 8/2012 | Kikuchi | 348/68 |
| 2013/0002128 A1* | 1/2013 | Daicho et al. | 313/503 |
| 2014/0055982 A1* | 2/2014 | Tao | F21V 9/16 362/84 |

* cited by examiner

*Primary Examiner* — Tuyet Vo
(74) *Attorney, Agent, or Firm* — Renner, Otto, Boisselle & Sklar, LLP

(57) ABSTRACT

An electric lamp includes a first light source and a second light source and power circuitry configured to selectively energize the first light source and the second light source. The first light source is configured to produce light that is substantially free of wavelengths below about 530 nanometers, and the second light source is configured to product light having wavelengths of less than about 530 nanometers. The electric lamp is configured to produce white or near-white light in a variety of color temperatures, while retaining good color rendering index.

17 Claims, 7 Drawing Sheets

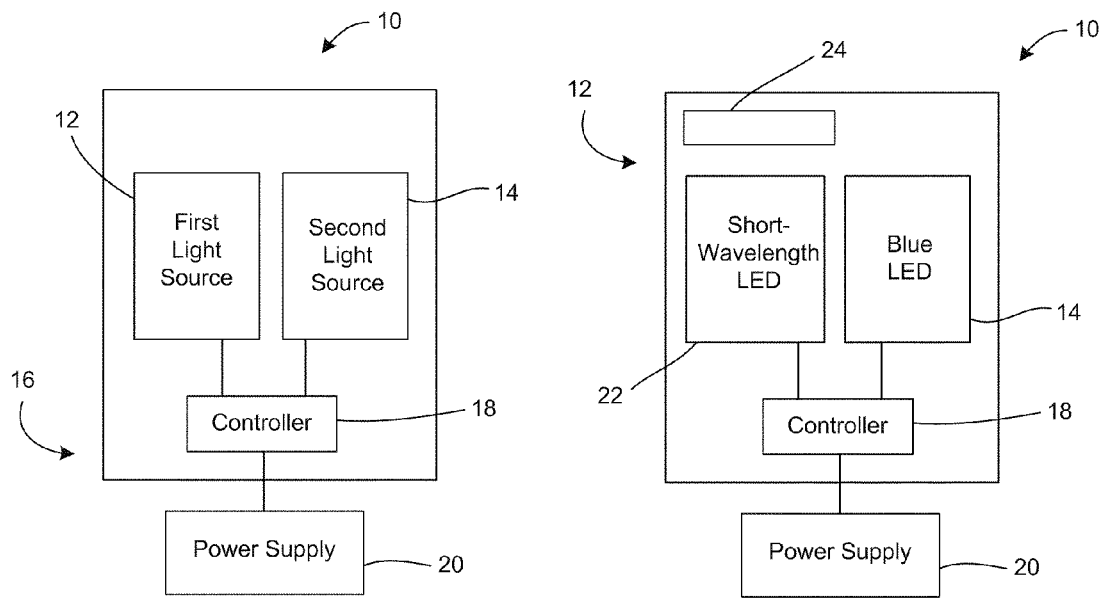
FIG. 1
FIG. 2
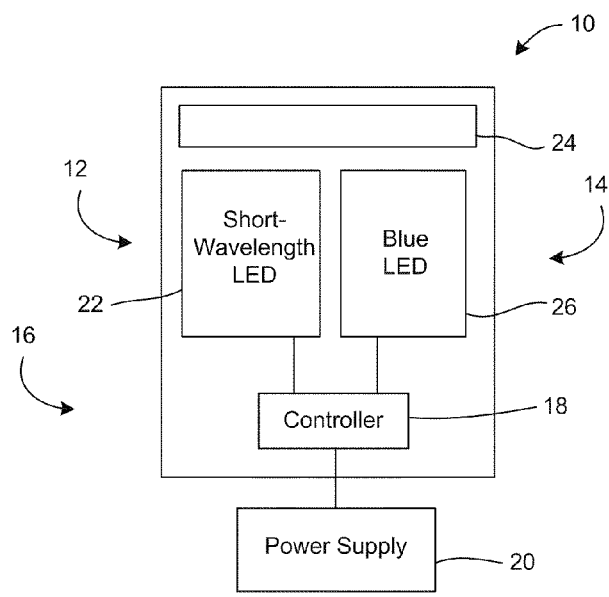
FIG. 3

MULTI-CHIP LIGHT EMITTING DIODE LIGHT DEVICE

RELATED APPLICATION DATA

The present application claims benefit of U.S. Provisional Application Ser. No. 61/217,938, filed Jun. 8, 2009, the disclosure of which is herein incorporated by reference in its entirety. The present application also is a continuation-in-part application of application Ser. No. 12/675,077, filed Feb. 24, 2010, the disclosure of which is herein incorporated by reference in its entirety, application Ser. No. 12/675,077 is a U.S. national phase application based on PCT Application No. PCT/US08/74208, filed Aug. 24, 2007, which claims benefit of U.S. Provisional Application Ser. No. 60/965,950, filed Aug. 24, 2007, and 60/995,996, filed Oct. 1, 2007, the disclosures of which are herein incorporated by reference in their entireties.

TECHNICAL FIELD OF THE INVENTION

The present invention relates generally to an illumination source, and more particularly, to a light emitting diode (LED) lighting device that is configured to produce white or near-white light at a variety of color temperatures, while retaining good color rendering index (CRI).

DESCRIPTION OF RELATED ART

Light emitting diodes (LEDs) are an important class of solid state devices that convert electric energy to light. LEDs generally comprise an active layer of semiconductor material sandwiched between two oppositely-doped layers. LEDs are regarded as highly-efficient light sources that surpass the efficiency of filament-based light sources, providing light with equal or greater brightness in relation to input power.

Efforts have been made to produce a LED lighting device in which color temperature can be varied. For example, in the case of a lighting device making use of red, green and blue LEDs, the intensities of the respective LEDs can be varied to vary the color temperature. This approach often leads to poor color rendering index.

Another conventional approach to varying color temperatures is by using standard white LEDs in combination with red LEDs. This approach does nothing to deal with potentially detrimental blue wavelength outputs, which are present regardless of the particular color temperature being generated.

SUMMARY

To produce white or near-white light in a variety of color temperatures, an electric lamp is provided with a first LED light source and a second LED light source. The first and second light sources are selectively energized by power circuitry to vary the color temperature of the output light and maintain the desired intensity through any time period. The temperature can be varied from full white to containing no blue and/or substantially reduced green to reduce the melatonin-suppressing effects found in ordinary lighting.

One aspect of the disclosed technology relates to a lamp that includes a first light source; a second light source; and power circuitry configured to selectively energize the first light source and/or the second light source. The first light source is configured to produce light that is substantially free of wavelengths below about 530 nanometers (nm), and the second light source is configured to produce light having wavelengths of less than about 530 nm.

According to another feature, the first light source and the second light source are configured to produce substantially white light when they are both energized.

According to another feature, the power circuitry is configured to control the intensities of the first light source and the second light source to provide substantially white light over a range of color temperatures.

According to another feature, the first light source is configured to produce light in a wavelength range that is substantially free of the wavelength spectrum most effective in suppressing the production of melatonin.

According to another feature, the first light source includes a first light emitting diode (LED) and a conversion material at least partially covering the LED.

According to another feature, the first light source comprises a LED chip that produces light having a peak wavelength of about 365 nm to about 400 nm and a phosphor positioned to receive at least a portion of the light from the LED chip, wherein the phosphor is configured to emit light having wavelengths greater than about 530 nm.

According to another feature, the first light source comprises a LED chip that produces light having a peak wavelength of about 400 nm to about 440 nm and a phosphor positioned to receive at least a portion of the light from the LED chip, wherein the phosphor is configured to emit light having wavelengths greater than about 530 nm.

According to another feature, the first LED is configured to emit light in the ultra violet (UV) wavelength spectrum.

According to another feature, the second light source is a second LED configured to emit light at wavelengths less than about 530 nm.

According to another feature, the first LED and the second LED are positioned to illuminate a phosphor material.

According to another feature, the first light source and the second light source are cooperative to produce white light.

According to another feature, the lamp includes a plurality of additional LEDs, operatively coupled to the power circuitry and selectively energizable by the power circuitry, wherein the plurality of additional LEDs includes at least one blue LED, at least one cyan LED and at least one green LED.

According to another feature, the first LED, the second LED and the plurality of additional LEDs are selectively operational to provide white light or substantially white light at a plurality of different color temperatures.

According to another feature, the lamp includes detection circuitry configured to detect the intensity of the light output from the lamp and/or the color temperature of the light output from the lamp; and a controller operatively coupled to the detection circuitry, wherein the controller is configured to control the intensity of the first LED, the second LED and the plurality of additional LEDs in response to signals received from the detection circuitry relating to the intensity and/or color temperature of the light output from the lamp.

According to another feature, the controller is configured to control power to the first LED, the second LED and the plurality of additional LEDs to maintain a predetermined intensity and/or color temperature of the light output from the lamp.

According to another feature, the lamp includes a filter positioned to receive light from the first light source and/or the second light source, wherein the filter is configured to absorb light within a wavelength range of about 450 nm to about 480 nm.

According to another feature, the lamp includes a filter positioned to receive light from the first light source and/or the second light source, wherein the filter is configured to absorb light within a wavelength range of about 470 nm to about 480 nm.

Another aspect of the disclosed technology relates to a lamp that includes a plurality of light emitting diodes (LEDs); circuitry operatively coupled to the plurality of LEDs and configured to selectively energize each of the plurality of LEDs; and a filter positioned to receive light output from at least some of the plurality of LEDs, wherein the filter is configured to absorb light within a wavelength range of about 450 nm to about 480 nm.

According to another feature, the plurality of LEDs are cooperative to produce light substantially white light at a plurality of controllable color temperatures.

Another aspect of the disclosed technology relates to a lamp that includes a housing at least partially covered by a conversion material; a first excitation light emitting diode (LED) disposed within the housing; a second LED disposed within the housing; and a controller configured to selectively energize the first excitation LED and the second LED; wherein the first excitation LED is positioned to provide light to the conversion material, and the conversion material is configured to produce white light substantially free of visible wavelengths below about 530 nanometers (nm) in response to light from the first excitation LED.

According to another feature, the second LED is configured to produce blue light at wavelengths less than about 530 nm.

According to another feature, the lamp includes a plurality of additional LEDs of different colors, the additional LEDs being positioned outside the housing, operatively coupled to the circuitry and selectively energizable by the circuitry.

According to another feature, the first excitation LED, the second LED and the plurality of additional LEDs are selectively operational to provide white light or substantially white light at a plurality of different color temperatures.

According to another feature, the lamp includes a detector operatively coupled to the controller, the detector being configured to detect the intensity of the light output from the lamp and/or the color temperature of the light output from the lamp. In addition, the controller is configured to control power to the first excitation LED, the second LED and the plurality of additional LEDs in response to signals received from the detector relating to the intensity and/or color temperature of the light output from the lamp.

According to another feature, the controller is configured to control the circuitry to maintain a predetermined intensity and/or color temperature of the light output from the lamp.

These and further features of the present invention will be apparent with reference to the following description and attached drawings. In the description and drawings, particular embodiments of the invention have been disclosed in detail as being indicative of some of the ways in which the principles of the invention may be employed, but it is understood that the invention is not limited correspondingly in scope. Rather, the invention includes all changes, modifications and equivalents coming within the spirit and terms of the claims appended thereto.

Features that are described and/or illustrated with respect to one embodiment may be used in the same way or in a similar way in one or more other embodiments and/or in combination with or instead of the features of the other embodiments.

It should be emphasized that the term "comprises/comprising" when used in this specification is taken to specify the presence of stated features, integers, steps or components but does not preclude the presence or addition of one or more other features, integers, steps, components or groups thereof.

BRIEF DESCRIPTION OF DRAWINGS

Many aspects of the invention can be better understood with reference to the following drawings. The components in the drawings are not necessarily to scale, emphasis instead being placed upon clearly illustrating the principles of the present invention. Likewise, elements and features depicted in one drawing may be combined with elements and features depicted in additional drawings. Moreover, in the drawings, like reference numerals designate corresponding parts throughout the several views.

FIG. 1 is a diagrammatic illustration of an electric lamp in accordance with one exemplary embodiment;

FIG. 2 is a diagrammatic illustration of an electric lamp in accordance with another exemplary embodiment;

FIG. 3 is a diagrammatic illustration of an electric lamp in accordance with another exemplary embodiment;

DETAILED DESCRIPTION OF EMBODIMENTS

Figure 4:
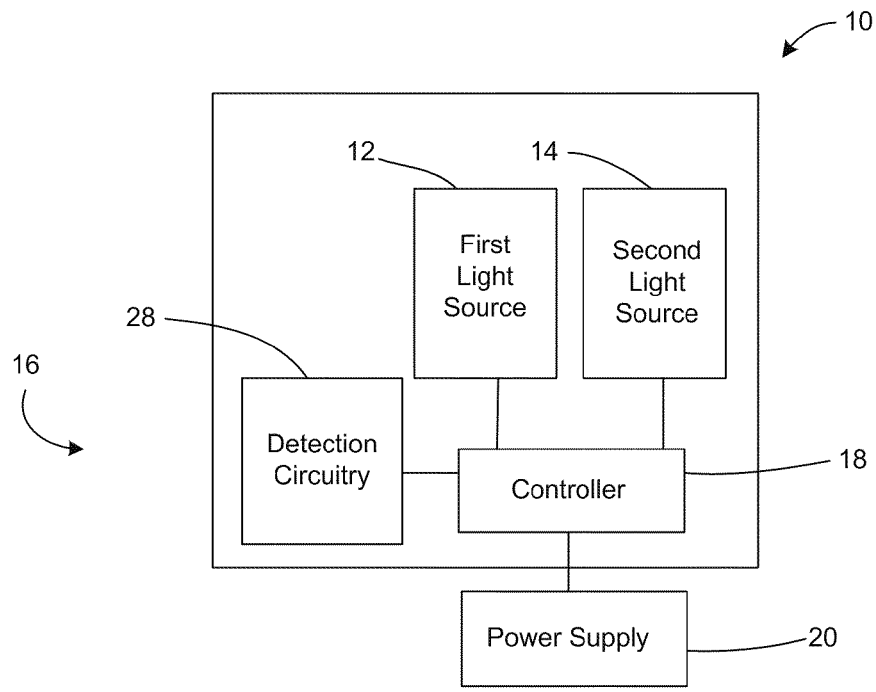
FIG. 4 is a diagrammatic illustration of an electric lamp in accordance with another exemplary embodiment.

In the detailed description that follows, like components have been given the same reference numerals regardless of whether they are shown in different embodiments of the present invention. To illustrate the present invention in a clear and concise manner, the drawings may not necessarily be to scale and certain features may be shown in somewhat schematic form.

Light bulbs have a color temperature and intensity associated with them. For light emitting diode (LED) light bulbs, these change over time. Efforts have been made to produce a LED lighting device in which color temperature can be varied. For example, in the case of a lighting device making use of red, green and blue LEDs, the intensities of the respective LEDs can be varied to vary the color temperature. This approach generally leads to poor color rendering index.

Another approach to varying color temperatures includes using standard white LEDs in combination with red LEDs. The white LED can be made up of a violet or blue LED with a phosphor positioned to receive light from the violet or blue LED, and configured to emit a variety of visible wavelengths, thereby appearing white. The white light LED is positioned together with red LEDs. To provide a cool white color temperature, the white light LEDs are operated by themselves. To provide a warmer color temperature, the red LEDs are turned on to mix with the white light LEDs.

While this design may be capable of providing cooler white light or warmer white light, the light output is accompanied by blue light output. It has been discovered that ordinary lights can be damaging to health because they produce the blue rays that have been found to cause melatonin suppression, especially if used during the evening preceding normal bedtime, when melatonin would be present. Melatonin is a hormone that promotes sleep, as well as being a powerful cancer fighter.

The present disclosure recognizes shortcomings with conventional LED lighting devices, and provides an electric lamp that is configured to vary the color temperature of the LED-based lamp and maintain the desired color temperature and the desired intensity through any desired time period. The lamp can produce white or near-white light in a variety of color temperatures, while retaining very good color rendering index. While producing warmer color temperatures, the lamp is configured to eliminate, or nearly eliminate, the range of blue wavelengths that suppress the hormone melatonin, e.g., wavelengths in a range of approximately 420 nanometers (nm) to approximately 530 nm, with a peak at approximately 470 nm. The lamp includes a first light source and a second light source and power circuitry configured to selectively energize the first light source and the second light source. The first light source is configured to produce light that is substantially free of wavelengths below about 530 nm, and the second light source is configured to produce light having wavelengths of less than about 530 nm.

Referring initially to FIG. 1, an electric lamp 10 is provided. As is described in more detail below, the electric lamp 10 is configured to produce white light or near-white light at a variety of color temperatures, e.g., ranging from a very warm color temperature to a very cool color temperature with a very good color rendering index (CRI). In accordance with one embodiment, the electric lamp is configured to maintain a desired color temperature and desired intensity through a desired time period by selectively energizing LED components of the electric lamp to compensate for changes in the output characteristics of various LED components within the electric lamp. As is described more fully below, the electric lamp includes a first light source and a second light source that are selectively energized to provide white light as well as near-white light without including portions of the wavelength spectrum that are most effective in suppressing the production of melatonin.

As shown in FIG. 1, the electric lamp includes a first light source 12 and a second light source 14 coupled to power circuitry (indicated generally by reference numeral 16), for example, a controller 18 operatively coupled to a power supply 20. The power circuitry 16 is configured to selectively energize the first light source 12 and/or the second light source 14, for example, depending on the time of day, or depending on a desired color temperature.

In one preferred embodiment (shown in FIG. 2 and FIG. 3), the first light source 12 includes a short-wavelength LED chip 22 (e.g., an ultraviolet (UV) LED chip having a peak intensity of about 365 nm to about 400 nm, or a violet LED chip producing light having a peak intensity of about 400 nm to about 440 nm) positioned to illuminate a phosphor element 24 or other suitable conversion element (e.g., mounted below a glass dome hemisphere coated with a phosphor), where the phosphor element is configured to produce light that is substantially free of wavelengths below about 530 nm in response to receiving excitation light from the short-wavelength LED chip 22. As is discussed more fully below, the first light source 12 can be implemented in a number of different ways without departing from the scope of the present invention.

As shown in FIG. 2 and FIG. 3, the second light source 14 is a blue LED 26 (e.g., an LED chip that produces light having a peak wavelength of about 470 nm, or an LED chip configured to produce light having wavelengths of less than about 530 nm). In the embodiment of FIG. 2, the blue LED 26 is positioned away from the phosphor element 24 such that it does not illuminate the phosphor element 24, while in FIG. 3, the blue LED 26 is positioned to illuminate the phosphor element 24 (e.g., mounted in a single package with the short-wavelength LED chip).

The first light source 12 and the second light source 14 are operatively coupled to power circuitry 16 in the form of a controller 18, which is coupled to a power supply 20, wherein the controller 18 is configured to selectively energize the first light source 12 and the second light source 14 depending on one or more desired conditions (e.g., depending on the desired color temperature, desired intensity and/or desired wavelength output—an output substantially free of the wavelength spectrum most effective in suppressing the production of melatonin). For example, the desired wavelength output maybe changed gradually from an output of white light (e.g., including most wavelengths within the visible spectrum) to an output substantially free of the wavelength spectrum most effective in suppressing the production of melatonin. This change in wavelength output may take place gradually over a predetermined period of time or more suddenly (e.g., in response to user input or other control signals indicative of a more abrupt change in wavelength output).

It will be appreciated that the controller 18 may be included in the lamp, in proximity to the lamp or remotely from the lamp. For example, in accordance with one exemplary embodiment, the controller can be located remotely from the lamp housing and configured to supply control signals to selectively energize the first light source 12 and the second light source 14 depending on one or more desired conditions. For example, in an industrial or office setting, the controller may take the form of a remote computer that can be configured to provide control signals to change the output of a plurality of lamps in a given area.

While many of the embodiments are described with respect a single UV LED chip and a single blue LED chip, it will be appreciated that the electric lamp may comprise a plurality of such LED chips arranged in various configurations depending upon the particular lighting application, for which the electric lamp will be used.

Figure 5:
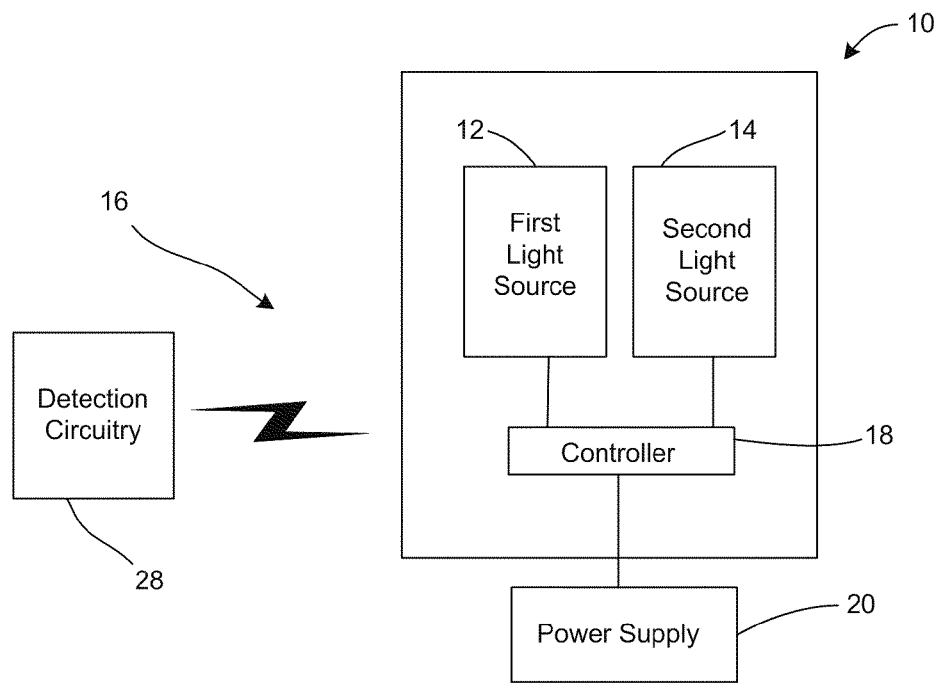
FIG. 5 is a diagrammatic illustration of an electric lamp in accordance with another exemplary embodiment.

FIG. 4 and FIG. 5 show other preferred embodiments in which the electric lamp 10 includes or otherwise is operatively coupled to detection circuitry 28 positioned and configured to monitor the intensities of the first light source 12 and the second light source 14. In the illustrated embodiment, the controller 18 is operatively coupled to the detection circuitry 28 such that the detection circuitry can provide a feedback signal to the controller based on variations in the relative intensities of the first light source 12 and the second light source 14, and how these intensities correspond to the desired color temperature for the electric lamp. Use of the detection circuitry 28 to monitor the intensities of the first light source 12 and the second light source 14 (as well as any auxiliary light sources used in connection with the first light source and the second light source) allows the electric lamp to keep a constant light level and color temperature, as called for by the user or an appropriate control algorithm.

FIG. 4 schematically represents an embodiment in which the detection circuitry is formed integrally with the electric lamp, while FIG. 5 schematically represents an embodiment in which the detection circuitry is positioned outside the lamp housing and communicates with the controller in a wireless manner.

It will be appreciated that the controller may be coupled to one or more input mechanisms, for example a timer or a user input where the user can adjust the desired color temperature and intensity of the lamp. In response to such user input, the controller will selectively energize the first light source and the second light source (as well as any auxiliary light sources operated together with the first light source and the second light source) to achieve the desired color temperature and intensity.

The user input and controller may take on a number of configurations without departing from the scope of the present invention. For example, the user input may include a switch (e.g., a simple mechanical switch or electromechanical switch that may be actuated manually by a user to shift the light output from a predetermined warm color temperature to a predetermined cool color temperature). Alternatively, the user input may be a radio frequency (RF) input or an infrared input that is configured to communicate wirelessly with a cooperative radio frequency controller, e.g., a controller associated with a remote control or a computer control. For example, an alarm clock may include a radio frequency transmitter or transmitter/receiver that is configured to transmit a command signal wirelessly to the RF switch at a predetermined time of day, e.g., at a predetermined time before the user's normal bedtime. Alternatively, the switch may receive command signals via an electric line coupled to the electric lamp.

Figure 6:
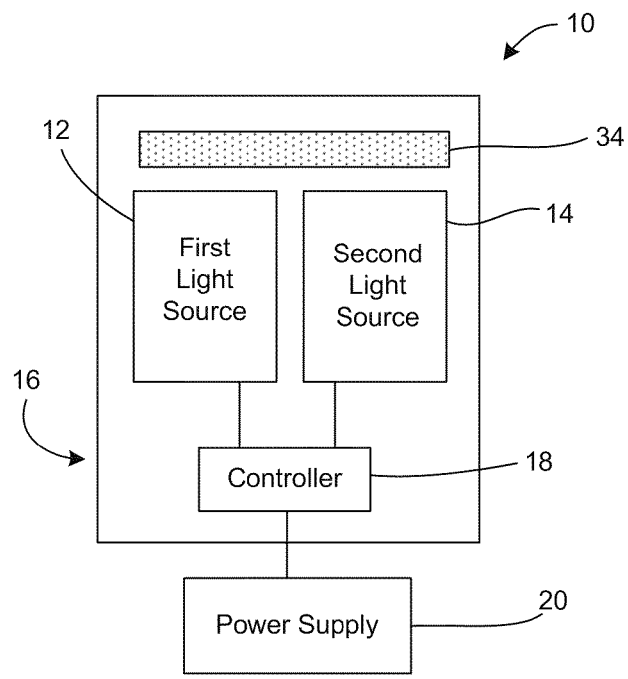
FIG. 6 is a diagrammatic illustration of an electric lamp in accordance with another exemplary embodiment.

FIG. 6 illustrates another exemplary embodiment in which light output from the first light source 12 and the second light source 14 passes through a filter 34. The filter may be selectively actuated depending on the desired light output or the filter may be integrally formed with the lamp (e.g., as a filter coating on the output window of the lamp). In one embodiment, the filter can be configured to filter out a relatively narrow range of wavelengths (e.g., wavelengths in the range of about 470 nm to about 480 nm). Filtering such a narrow range of wavelengths may have great benefits in that the visual appearance of light without wavelengths in the range of about 470 nm to about 480 nm will still have the appearance of white light, but without wavelengths that may be most effective in suppressing melatonin production. In another embodiment, the filter can be configured to filter out wavelengths below about 530 nm.

Figure 7:
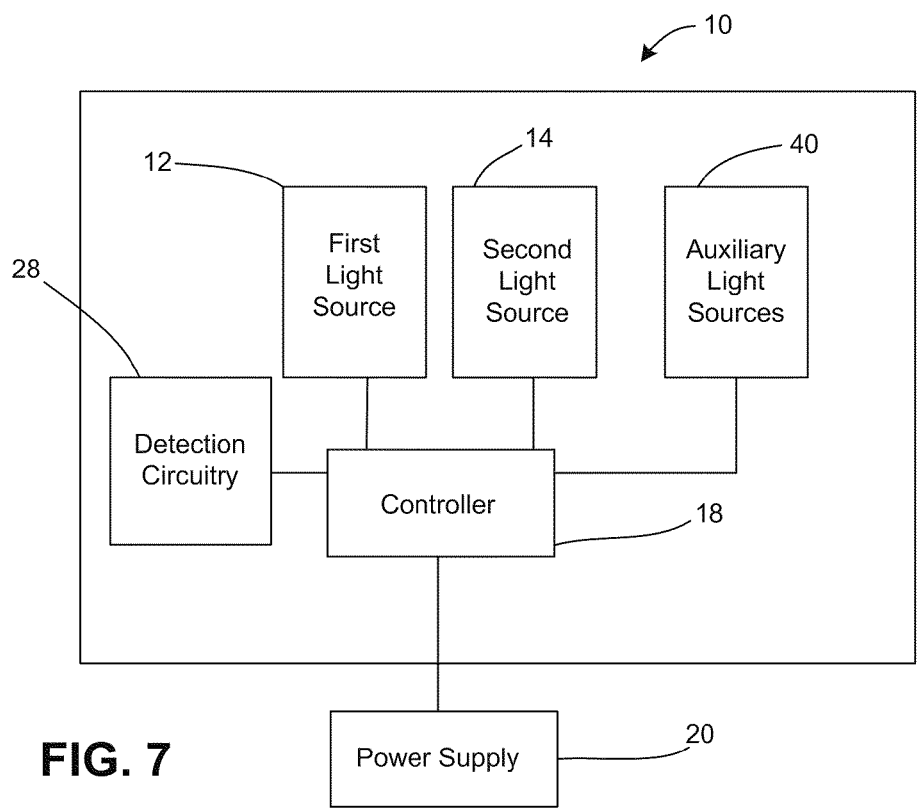
FIG. 7 is a diagrammatic illustration of an electric lamp in accordance with another exemplary embodiment.

FIG. 7 illustrates another embodiment in which the first light source 12 and the second light source 14 are operated in conjunction with or independent of a plurality of auxiliary light sources, for example, auxiliary LEDs (indicated generally by reference numeral 40). In one embodiment, the auxiliary light sources 40 are blue, cyan and/or green LEDs that can be used in conjunction with or independent of the first light source and the second light source to achieve more specific color temperatures. As is discussed more fully below, the auxiliary light sources can be housed within a fixture with the first light source and the second light source such that the outputs of all of the light sources are mixed.

Figure 8:
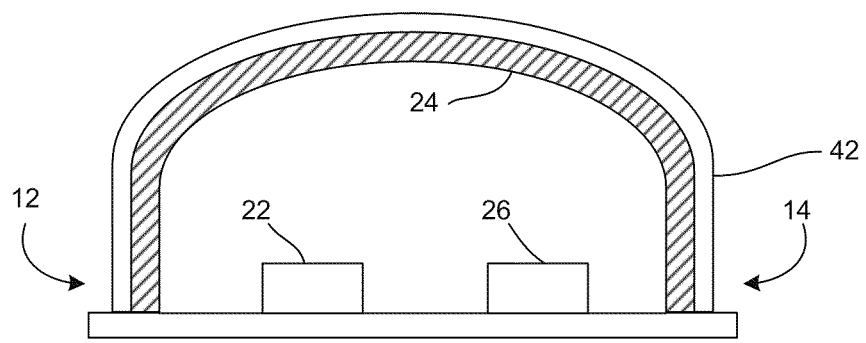
FIG. 8 is a diagrammatic illustration of the first light source and the second light source in accordance with an exemplary embodiment.
Figure 9:
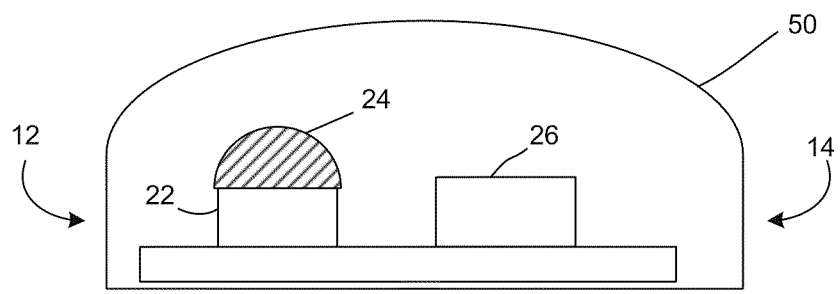
FIG. 9 is a diagrammatic illustration of the first light source and the second light source in accordance with an exemplary embodiment.
Figure 10:
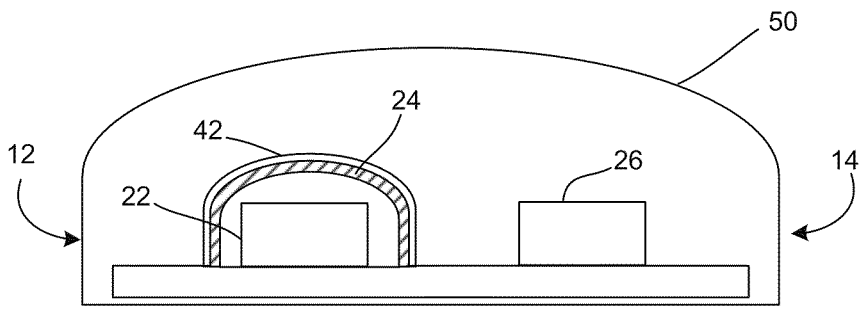
FIG. 10 is a diagrammatic illustration of the first light source and the second light source in accordance with an exemplary embodiment.

Turning now to FIGS. 8-10, various exemplary embodiments of the first light source 12 and the second light source 14 are provided. FIG. 8 shows an embodiment in which the first light source is comprised of a short-wavelength LED 22 (e.g., an ultraviolet LED chip having a peak intensity of about 365 nm to about 400 nm, or a violet LED chip producing light having a peak intensity of about 400 nm to about 440 nm) positioned to illuminate a phosphor element 24.

In this embodiment, the short-wavelength LED 22 serves as an excitation LED causing the phosphor element 24 to produce light that is substantially free of wavelengths below about 530 nm. In one exemplary embodiment, the term "substantially free" is meant to indicate that the light produced, whether it is produced directly by a LED or produced by a LED in combination with a phosphor element, does not produce light of a given wavelength or wavelength range at an intensity of greater than about five percent of the overall relative intensity produced. In the embodiment illustrated in FIG. 8, the short-wavelength LED 22 is positioned inside of a glass dome hemisphere 42 which is completely or partially coated with the phosphor element 24. In one exemplary embodiment, a suitable phosphor element is Intematix O5544, which has an emission peak of about 590 nm. It will be appreciated that the O5544 phosphor element has a wide excitation range from about 200 nm to about 570 nm. In the exemplary embodiment of FIG. 8, the second light source is a blue LED 26 (e.g., an LED chip that produces light having a peak wavelength of about 470 nm, or an LED chip configured to produce light having wavelengths of less than about 530 nm). In the illustrated embodiment, the blue LED 26 is positioned within the glass dome 42 such that it emits light incident on the phosphor element 24 and excites fluorescence by the phosphor element 24.

In this embodiment, the short-wavelength LED 22 and the blue LED 26 can be selectively energized to produce light at a predetermined color temperature with a predetermined intensity. For a very warm color temperature, where the light appears orange-amber, the short-wavelength LED is energized, exciting the phosphor element 24. In this instance, some of the short-wavelength light may pass through the phosphor, and some of the short-wavelength light is absorbed by the phosphor element, which becomes excited and emits light in a bell-shaped curve fashion versus wavelength. In this exemplary embodiment, the curve starts at about 530 nm, peaks at about 590 nm, and tapers off in the near-infrared range. In this instance, the excitation and emission spectrum is well-removed from the melatonin suppression wavelength region. Often, this type of light would be recommended in the hours before bedtime, as it lacks the blue component that has been found to suppress melatonin, but contains wavelength in the green, yellow and red visible spectral regions so one can continue regular activities before bedtime. The short-wavelength light that passes through the phosphor element is not in the visible range, and, therefore, does not affect the radiating visible light. In an optional embodiment, if the short-wavelength light is a concern, the glass dome 42 can be coated with a suitable filter to block the short-wavelength radiation.

During hours when melatonin suppression is not of concern, the blue LED 26 also can be activated and varied to provide substantially white light at cooler color temperatures. In this operational case, some of the blue light passes through the phosphor element 24, and some of the light is absorbed by the phosphor element 24, which becomes excited and emits light as before with a peak wavelength of about 590 nm. The blue light that passes through the phosphor is in the visible range, mixing with the emission spectrum of the excited phosphor element, to produce light that is perceived as white light. Again, the short-wavelength LED 22 excites the phosphor element and produces a warm color temperature, and the blue LED 26, which also excites the phosphor element would cool the color temperature based on the intensity of the blue LED. As discussed above with respect to FIG. 4 and FIG. 5, to keep a constant light level (intensity) and color temperature for the various cases discussed herein, the intensities of the short-wavelength and blue LEDs can be monitored and controlled by a suitable feedback mechanism making use of the detection circuitry 28 and the controller 18.

Turning now to FIG. 9, a preferred embodiment of the lamp 10 is illustrated. In this embodiment, the first light source 12 is implemented using a phosphor covered LED. In this embodiment, the short-wavelength LED 22 is covered by phosphor element 24, where the phosphor element is excited by the short-wavelength LED 22, emitting light in a range substantially free of wavelengths less than about 530 nm. In addition, the phosphor element absorbs most of the excitation light from the short-wavelength LED 22 such that the resultant light output is substantially free of wavelengths less than about 530 nm (see FIG. 11 and discussion below). As can be seen in FIG. 9, the blue LED 26 is positioned such that is does not excite any phosphor element 24. In a preferred embodiment, the first light source 12 can be implemented using a LUXEON® Rebel Phosphor-Converted (PC) Amber LED available from Philips. The LUXEON® Rebel LED product includes a short-wavelength LED chip configured to produce violet light having a wavelength having a peak intensity of about 400 nm to about 440 nm, the phosphor element 24 associated with the LUXEON® Rebel LED product fluoresces at wavelengths above about 530 nm in response to excitation from the short-wavelength LED. In this embodiment, the phosphor element 24 is confined to the short-wavelength chip 22, and is not positioned to receive light from the blue LED 26.

In this embodiment, the first light source 12 and the second light source 14 can be housed within a fixture or enclosure 50 of any suitable geometry (e.g., a cylinder or an envelope of any suitable shape, including that of a standard light bulb or dome) coated with a suitable diffuse white, material that mixes the light output from the first light source and the second light source.

FIG. 10 shows yet another variation similar to that shown in FIG. 9, except that the short-wavelength LED 22 is disposed within a smaller dome 42 completely or partially coated by a phosphor element 24, rather than having the phosphor element deposited directly on the short-wavelength LED chip. It will be appreciated that the embodiments of FIG. 9 and FIG. 10 can be operated in a manner similar to that described above with respect to FIG. 8 to selectively energizing the first light source and the second light source to produce white light or near-white light at a variety of controllable color temperatures.

Figure 11:
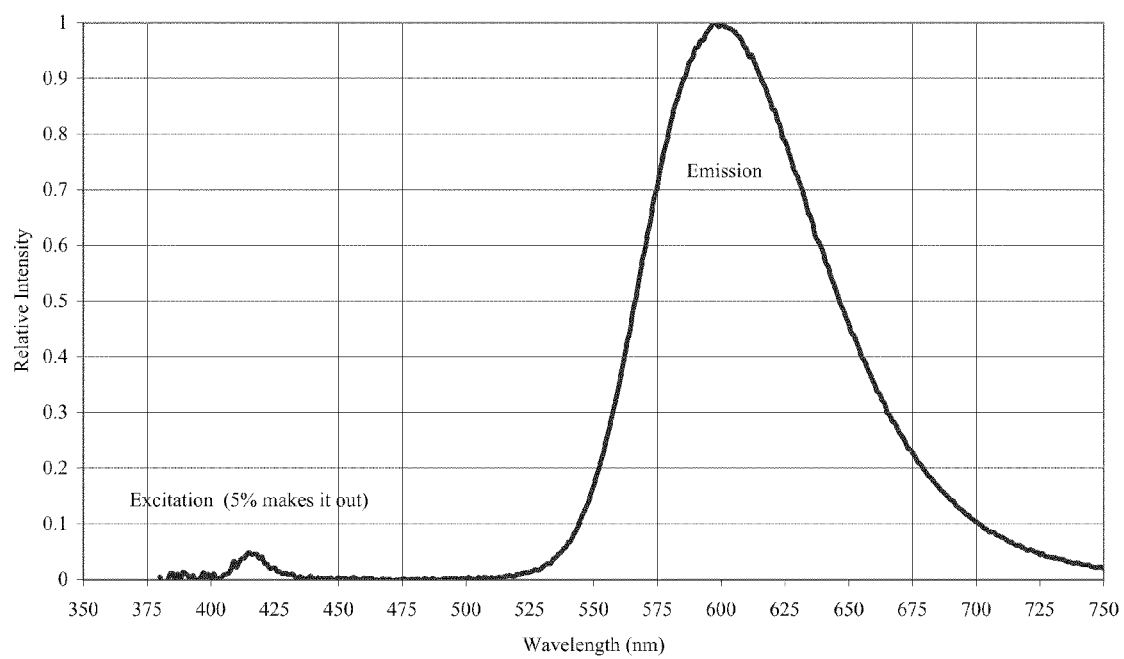
FIG. 11 is a plot of relative intensity versus wavelength for the exemplary first light source illustrated in FIG. 9.

FIG. 11 shows an emission spectrum corresponding to the LUXEON® Rebel LED referenced above. In this case, it can be seen that the emission from the phosphor element deposited on the short-wavelength LED chip peaks at about 590 nm and does not emit much, if any, light below of about 530 nm. Also, as can be seen from FIG. 11, a very small amount of excitation radiation from the short-wavelength LED makes it past the phosphor element. In the illustrated exemplary embodiment, only about five percent of the short-wavelength excitation light makes it through the phosphor element. As such, the LUXEON® Rebel LED serves as the first light source configured to produce light that is substantially free of wavelengths below of about 530 nm, or, stated differently, substantially free of wavelengths most effective in the suppression of melatonin.

Figure 12:
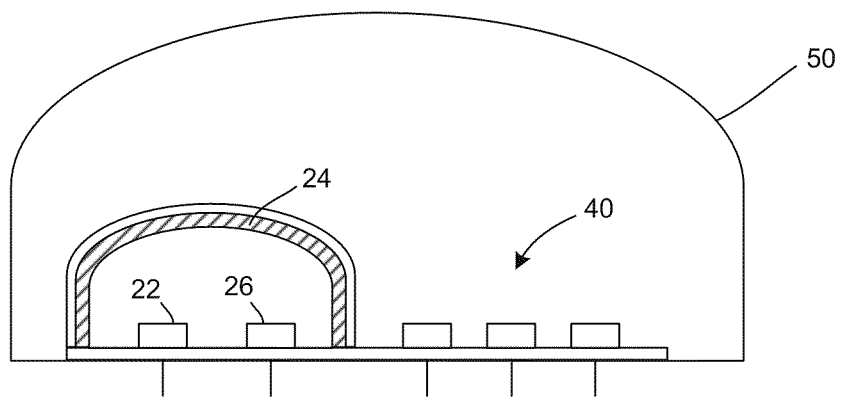
FIG. 12 is a diagrammatic illustration of an alternative embodiment of the electric lamp.
Figure 13:
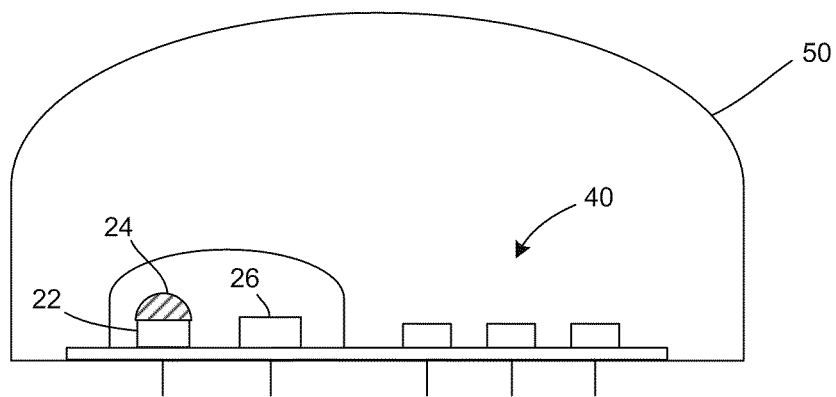
FIG. 13 is a diagrammatic illustration of an alternative embodiment of the electric lamp.
Figure 14:
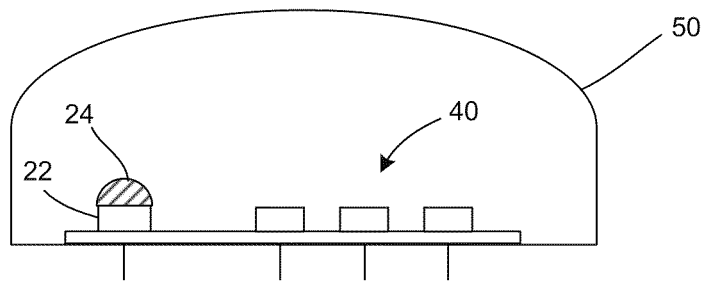
FIG. 14 is a diagrammatic illustration of an alternative embodiment of the electric lamp.

Turning now to FIGS. 12-14, other alternative embodiments are provided. In the illustrated embodiments, the first light source 12 and the second light source 14, whatever their actual implementation, are accompanied by a plurality of auxiliary light sources 40 (e.g., LED chips configured to emit blue light, cyan light and/or green light). The provision of the auxiliary LEDs 40 allows for further and more refined color temperature variation and control, if desired. As discussed above with respect to FIGS. 8-10, the auxiliary LEDs 40 can be confined with a fixture or enclosure 50 where the enclosure 50 can be white for color mixing and the output window can be covered with a diffusing powder coating or other suitable surface feature to mix the light output from the various LEDs within the enclosure. In this embodiment, to obtain a standard warm white color temperature, the first light source 12 and the second light source 14 can be operated by themselves. To obtain a more specific color temperature, the external blue, cyan and/or green LEDs 40 can be selectively energized, and monitored and controlled by the associated feedback mechanism to produce a wider variety of color temperatures. As discussed above, the enclosure 50 can take on any suitable geometry including a transparent but diffuse envelope including the shape of a standard light bulb or dome.

Figure 15:
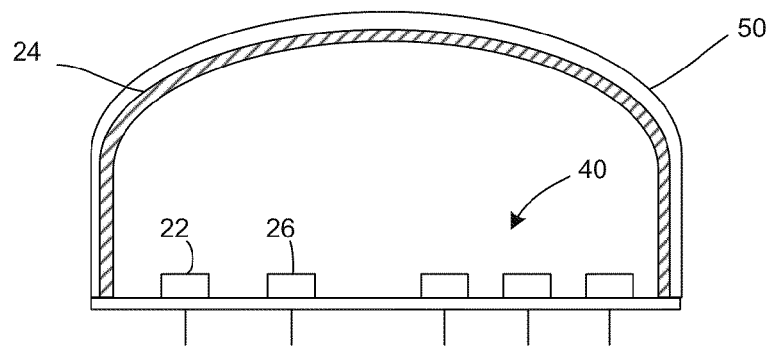
FIG. 15 is a diagrammatic illustration of an alternative embodiment of the electric lamp.
Figure 16:
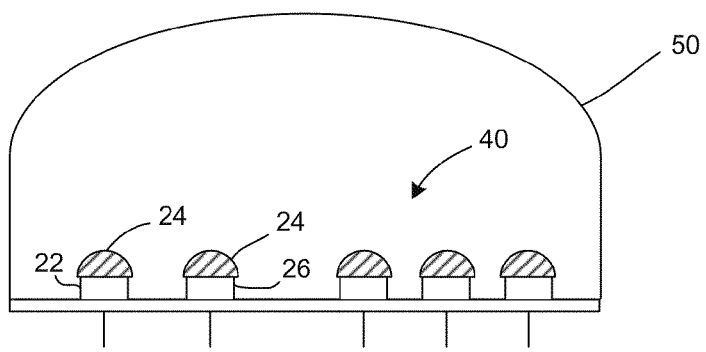
FIG. 16 is a diagrammatic illustration of an alternative embodiment of the electric lamp.

FIG. 12 shows an embodiment using the first and second light sources of FIG. 8 together with the auxiliary LEDs. FIG. 13 shows an embodiment similar to FIG. 9 in connection with the auxiliary LEDs. FIG. 14 shows an embodiment in which the first light source (e.g., the LUXEON® Rebel PC Amber LED is implemented together with the auxiliary LEDs, for example, a blue LED, a cyan LED and/or a green LED). FIG. 15 shows yet another embodiment where the short-wavelength LED 22, the blue LED 26 and the auxiliary LEDs are positioned such that they all emit light directed towards a phosphor element 24 to excite the phosphor element. FIG. 16 shows yet another embodiment where each of the short-wavelength LED, the blue LED, and the auxiliary LEDs each include phosphor element directly deposited on the respective LED chips or otherwise placed in close proximity to the respected LED chips.

Figure 17:
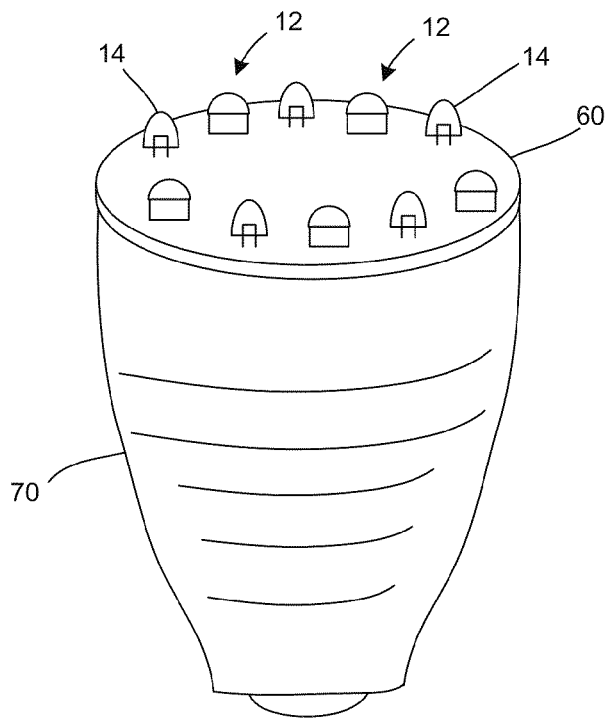
FIG. 17 is a diagrammatic illustration of a plurality of LEDs coupled to a threaded lamp connector.

While many of the embodiments have described with respect a single UV LED chip and a single blue LED chip (as well as single auxiliary LEDs in blue, cyan and/or green), it will be appreciated that the electric lamp may comprise a plurality of such LED chips arranged in various configurations depending upon the particular lighting application for which the electric lamp will be used. For example, FIG. 17 shows an exemplary LED array made up of short-wavelength LEDs, blue LEDs and/or auxiliary LEDs. The LED array includes a plurality of LEDs 30 mounted or otherwise electrically coupled to a printed circuit board assembly (PCBA) 60. In this exemplary embodiment, the LEDs are arranged in a circular or substantially circular pattern on the PCBA 60. In this embodiment, the PCBA may also serve as a heat sink alone or together with other heat sink cooling elements to help regulate the temperatures of the various LEDs during operation. The PCBA may include or otherwise be operatively coupled to suitable LED driver circuitry to selectively energize the various LEDs.

FIG. 17 also provides an exemplary embodiment of the LED array mounted on a suitable connector element 70, such as an Edison-type threaded connector, whereby various heat sinks or other cooling mechanisms, as well as driver/controller circuitry, may be housed within the connector 70. Of course, other geometries may be employed without departing from the scope of the present invention. For example, a part of the lamp body, such as the Edison-type threaded connector 70 itself, can serve as a heat sink. Thermally connecting the LEDs to the printed circuit board assembly 60 and/or the connector or other part of the lamp body allows for a thermal path to the base of the lamp, and in turn, to the socket, allowing the heat to flow away from the LEDs. This leaves the LEDs all concentrated and pointed away from the printed circuit board assembly.

One advantage of the LED arrangements described above is that the excitation of the short-wavelength, blue, cyan and/or green LEDs internal to the phosphor element, as well as the "external auxiliary" blue, cyan and/or green LEDs can be varied independently and controlled by the feedback mechanism described above to maintain a constant intensity and color temperature and/or vary the color temperature over a wide range, including a state in which blue light (e.g., light having a wavelength of less than about 530 nm is substantially suppressed). If more than one light bulb or lamp is used, the intensities and color temperatures can be equalized and/or varied simultaneously and still maintain the same color and/or intensity. This can be accomplished through multiple techniques, including hard wired or wireless systems.

Another advantage of the LED arrangements described above is that the color temperature and light intensity can be kept constant or substantially constant over the life of the product, thereby accounting for changes in output characteristics of the LEDs over the life of the product.

Another advantage of the LED arrangements described above is being able to go to the "no-blue" state, while still having good color rendering index (CRI) for the so-called "no blue" state. Given the output characteristics of the first light source (e.g., a wider band of wavelengths that are substantially free of wavelengths below about 530 nm) the LED lamp described herein provides for improved CRI over conventional lamps. In the white light state, with the first light source energized and with the blue, cyan and green LEDs energized, the present lamp is believed to provide a color rendering index in excess of 90 given that most, if not all of the visible spectrum is represented in the output light.

As will be appreciated by one of skill in the art, computer program elements and/or circuitry elements of the invention may be embodied in hardware and/or in software (including firmware, resident software, micro-code, etc.). The invention may take the form of a computer program product, which can be embodied by a computer-usable or computer-readable storage medium having computer-usable or computer-readable program instructions, "code" or a "computer program" embodied in the medium for use by or in connection with the instruction execution system. In the context of this document, a computer-usable or computer-readable medium may be any medium that can contain, store, communicate, propagate, or transport the program for use by or in connection with the instruction execution system, apparatus, or device. The computer-usable or computer-readable medium may be, for example but not limited to, an electronic, magnetic, optical, electromagnetic, infrared, or semiconductor system, apparatus, device, or propagation medium such as the Internet. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner. The computer program product and any software and hardware described herein form the various means for carrying out the functions of the invention in the example embodiments.

Specific embodiments of an invention are disclosed herein. One of ordinary skill in the art will readily recognize that the invention may have other applications in other environments. In fact, many embodiments and implementations are possible. The following claims are in no way intended to limit the scope of the present invention to the specific embodiments described above. In addition, any recitation of "means for" is intended to evoke a means-plus-function reading of an element and a claim, whereas, any elements that do not specifically use the recitation "means for", are not intended to be read as means-plus-function elements, even if the claim otherwise includes the word "means."

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

The invention claimed is:

1. A lamp comprising:
a first light source;
a second light source; and
power circuitry configured to selectively energize at least one of the first light source and the second light source;
wherein the first light source is configured to produce light that is substantially free of wavelengths below about 530 nanometers (nm), and the second light source is configured to produce light having wavelengths of less than about 530 nm.

2. The lamp of claim 1, wherein the first light source and the second light source are configured to produce substantially white light when they are both energized.

3. The lamp of claim 1, wherein the power circuitry is configured to control the intensities of the first light source and the second light source to provide substantially white light over a range of color temperatures.

4. The lamp of claim 1, wherein the first light source is configured to produce light in a wavelength range that is substantially free of the wavelength spectrum most effective in suppressing the production of melatonin.

5. The lamp of claim 1, wherein the first light source and the second light source are cooperative to produce white light.

6. The lamp of claim 1, further comprising:
a filter positioned to receive light from the first light source and/or the second light source, wherein the filter is configured to absorb light within a wavelength range of about 450 nm to about 480 nm.

7. The lamp of claim 1, further comprising:
a filter positioned to receive light from the first light source and/or the second light source, wherein the filter is configured to absorb light within a wavelength range of about 470 nm to about 480 nm.

8. The lamp of claim 1, wherein the first light source includes a first light emitting diode (LED) and a conversion material at least partially covering the LED.

9. The lamp of claim 8, wherein the first light source comprises a LED chip that produces light having a peak wavelength of about 365 nm to about 400 nm and a phosphor positioned to receive at least a portion of the light from the LED chip, wherein the phosphor is configured to emit light having wavelengths greater than about 530 nm.

10. The lamp of claim 8, wherein the first light source comprises a LED chip that produces light having a peak wavelength of about 400 nm to about 440 nm and a phosphor positioned to receive at least a portion of the light from the LED chip, wherein the phosphor is configured to emit light having wavelengths greater than about 530 nm.

11. The lamp of claim 8, wherein the first LED is configured to emit light in the ultra violet (UV) wavelength spectrum.

12. The lamp of claim 11, wherein the second light source is a second LED configured to emit light at wavelengths less than about 530 nm.

13. The lamp of claim 12, wherein the first LED and the second LED are positioned to illuminate a phosphor material.

14. The lamp of claim 11, further comprising a plurality of additional LEDs, operatively coupled to the power circuitry and selectively energizable by the power circuitry, wherein the plurality of additional LEDs includes at least one blue LED, at least one cyan LED and at least one green LED.

15. The lamp of claim 14, wherein the first LED, the second LED and the plurality of additional LEDs are selectively operational to provide white light or substantially white light at a plurality of different color temperatures.

16. The lamp of claim 14, further comprising:
  detection circuitry configured to detect the intensity of the light output from the lamp and/or the color temperature of the light output from the lamp; and
  a controller operatively coupled to the detection circuitry, wherein the controller is configured to control the intensity of the first LED, the second LED and the plurality of additional LEDs in response to signals received from the detection circuitry relating to the intensity and/or color temperature of the light output from the lamp.

17. The lamp of claim 16, wherein the controller is configured to control power to the first LED, the second LED and the plurality of additional LEDs to maintain a predetermined intensity and/or color temperature of the light output from the lamp.

* * * * *